United States Patent [19]

Fujii et al.

[11] Patent Number: 5,164,349

[45] Date of Patent: Nov. 17, 1992

[54] ELECTROMAGNETIC EFFECT MATERIAL

[75] Inventors: Toshitaka Fujii, Aichi; Atsushi Kajima, Fukuoka; Kyoji Ohdan, Yamaguchi; Ryoji Sugise, Yamaguchi; Iwao Okamoto, Yamaguchi, all of Japan

[73] Assignee: Ube Industries Ltd., Ube, Japan

[21] Appl. No.: 714,624

[22] Filed: Jun. 13, 1991

[30] Foreign Application Priority Data

Jun. 29, 1990 [JP] Japan ................. 2-169854
Jun. 29, 1990 [JP] Japan ................. 2-169855

[51] Int. Cl.$^5$ ............................................. C04B 35/46
[52] U.S. Cl. ................................. 501/134; 501/152; 252/62.59
[58] Field of Search .............................. 501/134, 152; 252/62.62, 62.63, 62.59

[56] References Cited

U.S. PATENT DOCUMENTS 4,978,646 12/1990 Bardhan et al. ................. 501/134

FOREIGN PATENT DOCUMENTS 2-170306 7/1990 Japan.

OTHER PUBLICATIONS

Magnetic Properties of Glassy Sputtered Films of the $Bi_2O_3$–$Fe_2O_3$–$ABO_2$ System $ABO_3$: $PbTiO_3BaTio_3$ MAG-89-117.

Magnetic and Dietectric Properties of the $Bi_2O_3$–$Fe_2O_3$–$PbTiO_3$ System Thin Files MAG-89-193.

Primary Examiner—Karl Group
Assistant Examiner—Chris Gallo
Attorney, Agent, or Firm—Kanesaka and Takeuchi

[57] ABSTRACT

An electromagnetic effect material comprising xA-yB-zC-wD-$\alpha$O series oxide ceramics, in which A and B represent one or more of element selected from the combination of elements represented by the general formula $ABO_3$ and capable of forming a perovskite structure material exhibiting a ferromagnetic or antiferromagnetic property, C and D represent one or more of elements selected from the combination of elements represented by the general formula $CDO_3$ and capable of forming a perovskite structure material exhibiting a ferroelectric, antiferroelectric or piezo-electric effect, with a proviso of excluding a case in which A and C are identical and B and D are identical to each other and a case in which A is Bi and B is Fe, x, y, z and w represent the ratio for the elements A, B, C and D, respectively, $x+y+z+w=1$, $0.01 < x < 0.95$, $0.01 < y < 0.95$, $0.01 < z < 0.95$, $0.01 < w < 0.95$ and $\alpha$ represents a number of oxygen atoms capable of satisfying atomic valence of other elements, and having a temperature region in which the electromagnetic bonding coefficient is greater than $1.0 \times 10^{-5}$ (emu cm/V g) within a temperature range from 250 to 700K.

12 Claims, No Drawings

ELECTROMAGNETIC EFFECT MATERIAL

FIELD OF THE INVENTION AND RELATED ART STATEMENT

The present invention concerns an electromagnetic effect material which is useful, for example, for digital information recording memory devices and various electronic devices.

Electromagnetic effect, that is, a phenomenon of inducing magnetization to a substance by an electric field applied externally or a phenomenon of inducing electric polarization to a substance by magnetic field applied externally has been reported in, for example, "The Electrodynamics of Magneto-electric Media" (1970), pp 1-19, "Magnetic Material Handbook" (published from Asakura Shoten), 1975, pp 989-999, etc.

However, most of materials for which the electromagnetic effect has been confirmed exhibit the effect at a temperature of lower than 100 K., with an example of the highest temperature being at 307 K. for $Cr_2O_3$. Accordingly, no stable effect can be expected near the room temperature in existent materials and, it is difficult to constitute practical devices, memories, etc. applied with electromagnetic effect. "xBi-yFe-zC-wD-$\alpha$O" series ceramics to be described later have been known by "Data of Magnetics Research Group of Electric Society", MAG 89-117 and MAG 89-193, published in Japan. However, it has not yet been known that the ceramics have an electromagnetic effect.

OBJECT AND SUMMARY OF THE INVENTION

The object of the present invention is to overcome the foregoing problem and provide a material capable of exhibiting an electromagnetic effect stably in a room temperature region.

The first invention of the present application provides an electromagnetic effect material comprising xA-yB-zC-wD-$\alpha$O series oxide ceramics, in which A and B represent one or more of elements selected from the combination of elements represented by the general formula $ABO_3$ and capable of forming a perovskite structure compound showing a ferromagnetic or antiferromagnetic property, C and D represent one or more of elements selected from the combination of elements represented by the general formula $CDO_3$ and capable of forming a perovskite structure compound exhibiting a ferroelectric, antiferroelectric or piezoelectric effect, with a proviso of excluding a case in which A and C are identical and B and D are identical with each other and a case where A is Bi and B is Fe, x, y, z and w represent the ratio of the elements A, B, C and D respectively, $x+y+z+w=1$, $0.01<x<0.95$, $0.01<y<0.95$, $0.01<z<0.95$ and $0.01<w<0.95$, $\alpha$ represents a number of oxygen atoms capable of satisfying atomic valence of other elements, and having a temperature region in which an electromagnetic bonding coefficient is greater than $1.0\times10^{-5}$ (emu cm/V g) in a temperature range from 250 to 700 K.

The xA-yB-zC-wD-$\alpha$O series oxide ceramics according to the present invention are in an amorphous state according to the X-ray diffractiometry which do not substantially form a crystal phase. It is considered that electromagnetic effect is caused due to such an amorphous state.

In the present invention, crystal phases such as a perovskite phase or spinel phase may be incorporated to some extent depending on the composition for a portion of the oxide ceramic.

In the formula described above, A and B are one or more of elements selected from the combination of elements represented by the general formula $ABO_3$ and capable of forming a perovskite structure compound showing a ferro-magnetic or antiferromagnetic property.

For the element A, there can be mentioned Na, K, Cs, Ca, Sr, Ba, Y, Cu, Cd, In, Tl Pb, Bi, lanthanide series elements comprising La, Ce, Pr, Nd, Pm, Sm, Eu, Gd, Tb, Dy, Ho, Er, Tm, Yb, and Lu, Pu and Am.

As the element B, there can be mentioned, for example, one or more of elements selected from 3d transition metal elements such as Ti, V, Cr, Mn, Fe, Co, Ni and Cu, and 4f rare earth elements such as La, Ce, Pr, Nd, Pm, Sm, Eu, Gd, Tb, Dy, Ho, Er, Tm and Yb, or a combination of the above-mentioned element, for example, with Li, Na, Mg, Al, Sc, Nb, Ta, Mo, W, Re, Ru, Os, Rh, Ir, Zn, Cd, Ga, In, Sn, Sb, Bi, Te, Lu, Pa, U and Pu. It is supposed that A and B contribute to the development of the magnetic property.

C and D are one or more of elements selected from the combination of elements represented by the general formula $CDO_3$ and capable of forming a perovskite type structure compound exhibiting ferromagnetic, anti-ferromagnetic or piezoelectric effect.

As the element C, there can be mentioned, for example, Na, K, Ca, Sr, Cd, Ba, Pb, Bi, La, Li, Ce, Nd, Y, Er, Ho, Tm, Yb and Lu. As the element D, there can be mentioned, for example, Nb, Ta, Ti, Zr, Hf, Fe, I, Mg, W, Cd, Mn, Co, Re, Sc, Nd, Ni, In, Yb, Ho, Lu, Li, Zn, Cr, Sb, Sn, Al, V and Y.

It is supposed that C and D contribute to the development of the dielectric property.

A case in which A and C are identical and B and D are identical each other and a case in which A is Fe and B is Bi are excluded.

Further, in a case in which X, y, z and W represent the ratio for the elements A, B, C and D, respectively, $x+y+z+w=1$, $0.01<x<0.95$, $0.01<y<0.95$, $0.01<z<0.95$ and $0.01<w<0.95$, the resultant oxide ceramics are in an amorphous state and develop electromagnetic effect.

Further, in the present invention, the electromagnetic effect material constituted with the oxide ceramics described above has a temperature region in which the electromagnetic bonding coefficient is greater than $1.0\times10^{-5}$ (emu cm/V g) within a temperature range from 250 to 700 K.

There is no particular restriction for the method of preparing the electromagnetic effect material according to the present invention so long as the material having the foregoing property can be obtained and there can be mentioned, for instance, a reactive sputtering method, solgel method or the like.

For instance, the electromagnetic effect material according to the present invention can be prepared by the reactive sputtering method as shown below.

A thin film is prepared on a substrate by a reactive sputtering method in an oxygen atmosphere using, as a target, a powder of respective oxides of A and B or $ABO_3$ and a powder of respective oxides of C and D or $CDO_3$ in the above-mentioned formula which are mixed and sintered.

Then, the thin film was applied with a heat treatment at 400° to 900° C. in an air atmosphere to obtain the electromagnetic material according to the present invention.

Although the thin film just after the sputtering does not exhibit the electromagnetic effect, it exhibits the electromagnetic effect by applying the heat treatment.

The second invention provides an electromagnetic effect material comprising xBi-yFe-zC-wD-$\alpha$O series oxide ceramics, in which C and D represent one or more of elements selected from the combination of elements represented by the general formula $CDO_3$ and capable of forming a perovskite structure compound exhibiting a ferromagnetic, antiferro-magnetic or piezoelectric property, with a proviso of excluding a case in which C is Bi and D is Fe, x, y, z and w represent the ratio of elements Bi, Fe, C and D respectively, $x+y+z+w=1$, $0.01<x<0.95$, $0.01<y<0.95$, $0.01<z<0.95$, $0.01<w<0.95$ and $\alpha$ represents a number of oxygen capable of satisfying the atomic valence of other elements, and having a temperature region in which the electromagnetic bonding coefficient is greater than $1.0\times10^{-5}$ (emu cm/V g) within a temperature range from 250 to 700 K.

In the present invention, a crystal phase such as perovskite and/or spinel phase may be incorporated to some extent depending on the composition for a portion of the oxide ceramics.

It is supposed that Bi in the formula contributes to the development of the electromagnetic effect, while Fe contribute to the development of the magnetic property.

C and D are one or more of elements selected from the combination of elements represented by the general formula $CDO_3$ and capable of forming a perovskite structure compound exhibiting a ferroelectric, antiferroelectric or piezoelectric effect.

As the elements C and D, there can be mentioned the same elements for C and D in the first invention described previously, with a proviso of excluding a case in which C is Bi and D is Fe.

It is supposed that C and D contribute to the development of the dielectric property.

Further, in a case where x, y, z, and w represent the ratio for of the elements Bi, Fe, C and D, $x+y+z+w=1$, $0.01<x<0.95$, $0.01<y<0.95$, $0.01<z<0.95$ and $0.01<w<0.95$, the resultant oxide ceramics are in an amorphous state to develop the electromagnetic effect.

In the present invention, the electromagnetic effect material constituted with the oxide ceramics have a temperature region in which the electromagnetic bonding coefficient is greater than $1.0\times10^{-5}$ (emu cm/V g) within a temperature range from 250 to 700 K.

For the method of preparing the electromagnetic effect material according to the present invention, there can be mentioned a method of preparing the material according to the first invention previously described.

The third invention concerns a method of using the xA-yB-zC-wD-$\alpha$O series oxide ceramics or the xBi-yFe-zC-wD-$\alpha$O series oxide ceramics as the electromagnetic effect material. The oxide ceramics of the second invention are in an amorphous state and present without substantially forming a crystal phase according to X-ray diffractiometry. It is considered that the electromagnetic effect is developed due to the amorphous state.

PREFERRED EMBODIMENTS

The present invention will now be explained more specifically by way of examples.

COMPARATIVE EXAMPLE 1

An electrode was formed by a conductive silver paste on a surface in perpendicular to the C axis of single crystal plate of $Cr_2O_3$.

For the thus resultant thin film, and electric magnetic bonding coefficient ($\alpha$) was measured under the intensity of an electric field applied at 10 kV/cm. As a result, $\alpha$ was $1.2\times10^{-5}$ (emu cm/V g) at 300 K. and the electromagnetic effect was not developed at 350 K.

EXAMPLE 1

At first, a Pt electrode layer was formed by means of a sputtering method on a silicon substrate. Then, a thin oxide layer was prepared on the Pt electrode layer by a reactive sputtering method in an oxygen atmosphere using, as a target, a filled powder mixture of $Dy_2O_3$, $Fe_2O_3$, PbO and $TiO_2$ which were mixed and sintered.

The sputtering gas is a gas mixture of $Ar:O_2=7:3$ in which the purity of each of Ar and $O_2$ used was higher than 99.995%.

Prior to the film formation, the temperature of the substrate was elevated to 200° C. to eliminate water content mainly adsorbed on the surface of the substrate. Further, pre-sputtering was applied for about 30 min before film formation to clean the surface of the target so as to stabilize the film quality and the thin film composition upon film formation by sputtering.

Before introducing the sputtering gas, it was confirmed that the degree of vacuum reached less than $2\times10^{-7}$ Torr. During sputtering-film formation, the total gas pressure was kept constant at 25 mTorr. During sputtering, the anode made of Copper for fixing the substrate was cooled with water to maintain the temperature of the substrate to 20°–25° C. during film formation. Sputtering-film formation was applied for 30 to 60 min while setting the RF power charged to 110 W. Since the sputtering rate varied depending on the composition of the target, scattering was observed for the thickness of the thus obtained film, and each of the films showed about 500 to 1000 nm thickness.

The thin film just after the sputtering was applied with a heat treatment at 600° C. for 3 hours in an air atmosphere.

Furthermore, a Pt electrode layer was formed on the thin film by a sputtering method. The thickness for the deposition film of each of two Pt electrode layers was set to 200 nm.

Sputtered oxide thin films comprising Dy, Fe, Pb and Ti were prepared by the process for forming the thin films as described above. For each of the thin films, an electric magnetic bonding coefficient ($\alpha$) was measured under the intensity of an electric field applied at 10 kV/cm. The results are collectively shown in Table 1. According to the table, the electromagnetic bonding coefficient of about $1.1\times10^{-4}$ (emu cm/Vg) at the minimum was observed even at 350 K.

TABLE 1

| Dy x | Fe y | Pb z | Ti w | $\alpha_{T=300K}$ | $\alpha_{T=350K}$ |
|---|---|---|---|---|---|
| 0.95 | 0.02 | 0.01 | 0.01 | $1.5\times10^{-4}$ | $1.1\times10^{-4}$ |
| 0.02 | 0.95 | 0.01 | 0.01 | $1.4\times10^{-4}$ | $1.2\times10^{-4}$ |
| 0.01 | 0.01 | 0.95 | 0.02 | $3.2\times10^{-4}$ | $1.1\times10^{-4}$ |

TABLE 1-continued

| Dy x | Fe y | Pb z | Ti w | $\alpha_{T=300K}$ | $\alpha_{T=350K}$ |
|---|---|---|---|---|---|
| 0.01 | 0.01 | 0.02 | 0.95 | $2.5 \times 10^{-4}$ | $2.0 \times 10^{-4}$ |
| 0.80 | 0.10 | 0.05 | 0.05 | $6.7 \times 10^{-4}$ | $4.5 \times 10^{-4}$ |
| 0.10 | 0.80 | 0.05 | 0.05 | $4.7 \times 10^{-4}$ | $3.6 \times 10^{-4}$ |
| 0.05 | 0.05 | 0.80 | 0.10 | $3.6 \times 10^{-4}$ | $3.2 \times 10^{-4}$ |
| 0.05 | 0.05 | 0.10 | 0.80 | $3.7 \times 10^{-4}$ | $3.1 \times 10^{-4}$ |
| 0.60 | 0.20 | 0.10 | 0.10 | $8.9 \times 10^{-4}$ | $6.2 \times 10^{-4}$ |
| 0.20 | 0.60 | 0.10 | 0.10 | $7.8 \times 10^{-4}$ | $5.6 \times 10^{-4}$ |
| 0.10 | 0.10 | 0.60 | 0.20 | $4.3 \times 10^{-4}$ | $2.6 \times 10^{-4}$ |
| 0.10 | 0.10 | 0.20 | 0.60 | $3.8 \times 10^{-4}$ | $2.2 \times 10^{-4}$ |
| 0.40 | 0.40 | 0.10 | 0.10 | $1.8 \times 10^{-3}$ | $8.5 \times 10^{-4}$ |
| 0.10 | 0.10 | 0.40 | 0.40 | $4.5 \times 10^{-4}$ | $3.4 \times 10^{-4}$ |
| 0.30 | 0.20 | 0.20 | 0.20 | $2.3 \times 10^{-3}$ | $1.8 \times 10^{-3}$ |

EXAMPLE 2

At first, a Pt electrode layer was formed by means of a sputtering method on a silicon substrate. Then, a thin oxide layer was prepared on the Pt electrode layer by a reactive sputtering method in an oxygen atmosphere using a filled powder mixture of $Gd_2O_3$, $Fe_2O_3$, PbO and $ZrO_2$.

The sputtering gas is a gas mixture of $Ar:O_2 = 7:3$ in which the purity of each of Ar and $O_2$ used was higher than 99.995%.

Prior to the film formation, the temperature of the substrate was elevated to 200° C. to eliminate water content mainly adsorbed on the surface of the substrate. Further, pre-sputtering was applied for about 30 min before film formation to clean the surface of the target so as to stabilize the film quality and the thin film composition upon film formation by sputtering.

Before introducing the sputtering gas, it was confirmed that the degree of vacuum reached less than $2 \times 10^{-7}$ Torr. During sputtering film formation, the total gas pressure was kept constant at 25 mTorr. During sputtering, the anode made of Copper for fixing the substrate was cooled with water to maintain the temperature of the substrate during film formation to 20°-25° C. Sputtering film formation was applied for 30 to 60 min while setting the RF power charged to 110 W. Since the sputtering rate varied depending on the composition of the target, scattering was observed for the thickness of the thus obtained film, and each of the films showed about 500 to 1000 nm thickness.

The thin film just after the sputtering was applied with a heat treatment at 600° C. for 3 hours in an air atmosphere.

Furthermore, a Pt electrode layer was formed on the thin film by a sputtering method. The thickness for the deposited film of each of the two Pt electrode layers was set to 200 nm.

Sputtered oxide thin films comprising Gd, Fe, Pb and Zr were prepared by the process for forming the thin films as described above. For each of the thin film, an electric magnetic bonding coefficient ($\alpha$) was measured under the intensity of an electric field applied at 10 kV/cm. The results are collectively shown in Table 2. According to the table, the electromagnetic bonding coefficient of about $1.0 \times 10^{-4}$ (emu cm/Vg) at the minimum was observed even at 350 K.

TABLE 2

| Gd x | Fe y | Pb z | Zr w | $\alpha_{T=300K}$ | $\alpha_{T=350K}$ |
|---|---|---|---|---|---|
| 0.95 | 0.02 | 0.01 | 0.01 | $1.9 \times 10^{-4}$ | $1.2 \times 10^{-4}$ |
| 0.02 | 0.95 | 0.01 | 0.01 | $1.8 \times 10^{-4}$ | $1.0 \times 10^{-4}$ |

TABLE 2-continued

| Gd x | Fe y | Pb z | Zr w | $\alpha_{T=300K}$ | $\alpha_{T=350K}$ |
|---|---|---|---|---|---|
| 0.01 | 0.01 | 0.95 | 0.02 | $4.2 \times 10^{-4}$ | $2.2 \times 10^{-4}$ |
| 0.01 | 0.01 | 0.02 | 0.95 | $3.6 \times 10^{-4}$ | $2.2 \times 10^{-4}$ |
| 0.80 | 0.10 | 0.05 | 0.05 | $7.9 \times 10^{-4}$ | $5.3 \times 10^{-4}$ |
| 0.10 | 0.80 | 0.05 | 0.05 | $6.8 \times 10^{-4}$ | $4.2 \times 10^{-4}$ |
| 0.05 | 0.05 | 0.80 | 0.10 | $2.7 \times 10^{-4}$ | $1.4 \times 10^{-4}$ |
| 0.05 | 0.05 | 0.10 | 0.80 | $3.8 \times 10^{-4}$ | $3.2 \times 10^{-4}$ |
| 0.60 | 0.20 | 0.10 | 0.10 | $9.5 \times 10^{-4}$ | $7.2 \times 10^{-4}$ |
| 0.20 | 0.60 | 0.10 | 0.10 | $8.1 \times 10^{-4}$ | $4.9 \times 10^{-4}$ |
| 0.10 | 0.10 | 0.60 | 0.20 | $3.8 \times 10^{-4}$ | $1.9 \times 10^{-4}$ |
| 0.10 | 0.10 | 0.20 | 0.60 | $4.8 \times 10^{-4}$ | $2.9 \times 10^{-4}$ |
| 0.40 | 0.40 | 0.10 | 0.10 | $3.6 \times 10^{-3}$ | $9.1 \times 10^{-4}$ |
| 0.10 | 0.10 | 0.40 | 0.40 | $5.5 \times 10^{-4}$ | $4.8 \times 10^{-4}$ |
| 0.30 | 0.20 | 0.20 | 0.20 | $3.8 \times 10^{-3}$ | $2.5 \times 10^{-3}$ |

EXAMPLE 3

At first, a Pt electrode layer was formed by means of a sputtering method on a silicon substrate.

Then, a thin oxide layer was prepared on the Pt electrode layer by a reactive sputtering method in an oxygen atmosphere using, as a target, a filled powder mixture for each of oxides comprising $M_2O_3$ (in which M represents an element of La, Ce, Pr, Nd, Sm, Eu, Gd, Tb, Dy, Ho, Er, Tm, Yb and Lu), $Bi_2O_3$ and $BaTiO_3$.

The sputtering gas is a gas mixture of $Ar:O_2 = 7:3$ in which the purity of each of Ar and $O_2$ used was higher than 99.995%.

Prior to the film formation, the temperature of the substrate was elevated to 200° C. to eliminate water content mainly adsorbed on the surface of the substrate. Further, pre-sputtering was applied for about 30 min before film formation to clean the surface of the target so as to stabilize the film quality and the thin film composition upon film formation by sputtering.

Before introducing the sputtering gas, it was confirmed that the degree of vacuum reached less than $2 \times 10^{-7}$ Torr. During sputtering film formation, the total gas pressure was kept constant at 25 mTorr. During sputtering, the anode made of Copper for fixing the substrate was cooled with water to maintain the temperature of the substrate during film formation to 20°-25° C. Sputtering-film formation was applied for 30 to 60 min while setting the RF power charged to 110 W. Since the sputtering rate varied depending on the composition of the target, scattering was observed for the thickness of the thus obtained film, and each of the films showed about 500 to 1000 nm thickness.

The thin film just after the sputtering was applied with a heat treatment at 600° C. for 3 hours in an air atmosphere.

Furthermore, a Pt electrode layer was formed on the thin film by a sputtering method. The thickness for the deposition film of each of the two Pt electrode layers was set to 200 nm.

Sputtered oxide thin films comprising M, Bi, Ba and Ti were prepared by the process for forming the thin films as described above. For each of the thin films, an electric magnetic bonding coefficient ($\alpha$) was measured under the intensity of an electric field applied at 10 kV/cm. The results are collectively shown in Table 3. On Table 3, the values of x, y, z and w were 0.30, 0.30, 0.20 and 0.20 respectively where x, y, z and w were denoted in xBi-yM-zBa-wTi-$\alpha$O. According to the table, the electromagnetic bonding coefficient of about $0.2 \times 10^{-3}$ (emu cm/Vg) at the minimum was observed even at 350 K.

TABLE 3

| M | $\alpha_{T=300K}$ | $\alpha_{T=350K}$ |
| --- | --- | --- |
| La | $1.4 \times 10^{-3}$ | $0.6 \times 10^{-3}$ |
| Ce | $1.9 \times 10^{-3}$ | $0.8 \times 10^{-3}$ |
| Pr | $0.9 \times 10^{-3}$ | $0.4 \times 10^{-3}$ |
| Nd | $2.1 \times 10^{-3}$ | $0.8 \times 10^{-3}$ |
| Sm | $1.9 \times 10^{-3}$ | $0.8 \times 10^{-3}$ |
| Eu | $2.3 \times 10^{-3}$ | $1.1 \times 10^{-3}$ |
| Gd | $2.3 \times 10^{-3}$ | $1.2 \times 10^{-3}$ |
| Tb | $2.5 \times 10^{-3}$ | $1.3 \times 10^{-3}$ |
| Dy | $2.2 \times 10^{-3}$ | $0.9 \times 10^{-3}$ |
| Ho | $2.1 \times 10^{-3}$ | $0.9 \times 10^{-3}$ |
| Er | $2.1 \times 10^{-3}$ | $0.9 \times 10^{-3}$ |
| Tm | $1.9 \times 10^{-3}$ | $0.8 \times 10^{-3}$ |
| Yb | $1.4 \times 10^{-3}$ | $0.6 \times 10^{-3}$ |
| Lu | $1.6 \times 10^{-3}$ | $0.6 \times 10^{-3}$ |

What is claimed is:

1. An electromagnetic effect material comprising xA-yB-zC-wD-αO series oxide ceramics, in which A and B represent one or more of elements selected from the combination of elements represented by the general formula $ABO_3$ and capable of forming a perovskite structure material exhibiting a ferromagnetic or antiferromagnetic property and A representing one or more of elements selected from the group consisting of La, Ce, Pr, Nd, Pm, Sm, Eu, Gd, Tb, Dy, Ho, Er, Tm, Yb and Lu, C and D represent one or more of elements selected from the combination of elements represented by the general formula $CDO_3$ and capable of forming a perovskite structure material exhibiting a ferroelectric, antiferroelectric or piezoelectric effect, with a proviso of excluding a case in which A and C are identical and B and D are identical to each other, x, y, z and w represent the ratio for the elements A, B, C and D, respectively, $x+y+z+w=1$, $0.01<x<0.95$, $0.01<y<0.95$, $0.01<z<0.95$ and $0.01<w<0.95$ and α represents a number of oxygen atoms capable of satisfying atomic valence of other elements, and having a temperature region in which the electromagnetic bonding coefficient is greater than $1.0 \times 10^{-5}$ (emu cm/V g) within a temperature range from 250 to 700 K.

2. A material as defined in claim 1, wherein B represents one or more of elements selected from Ti, V, Cr, Mn, Fe, Co, Ni, Cu, La, Ce, Pr, Nd, Pm, Sm, Eu, Gd, Tb, Dy, Ho, Er, Tm, Yb and Lu.

3. A material as defined in claim 2, wherein B represents a combination of at least one of elements as defined in claim 2, with at least one of elements selected from Li, Na, Mg, Al, Sc, Nb, Ta, Mo, W, Re, Ru, Os, Rh, Ir, Zn, Cd, Ga, In, Sn, Sb, Bi, Te, Lu, Pa, U and Pu.

4. A material as defined in claim 1, wherein C represents one or more of elements selected from Na, K, Ca, Sr, Cd, Ba, Pb, Bi, La, Li, Ce, Nd, Y, Er, Ho, Tm, Yb and Lu.

5. A material as defined in claim 1, wherein D represents one or more of elements selected from Nb, Ta, Ti, Zr, Hf, Fe, I, Mg, W, Cd, Mn, Co, Re, Sc, Nd, Ni, In, Yb, Ho, Lu, Li, Zn, Cr, Sb, Sn, Al, V and Y.

6. An electromagnetic effect material comprising xA-yB-zC-wD-αO series oxide ceramics, in which A and B represent one or more of elements selected from the combination of elements represented by the general formula $ABO_3$ and capable of forming a perovskite structure material exhibiting a ferromagnetic or antiferromagnetic property and B representing one or more of elements selected from the group consisting of La, Ce, Pr, Nd, Pm, Sm, Eu, Gd, Tb, Dy, Ho, Er, Tm, Yb and Lu, C and D represent one or more of elements selected from the combination of elements represented by the general formula $CDO_3$ and capable of forming a perovskite structure material exhibiting a ferroelectric, antiferroelectric or piezoelectric effect, with a proviso of excluding a case in which A and C are identical and B and D are identical to each other, x, y, z and w represent the ratio for the elements A, B, C and D, respectively, $x+y+z+w=1$, $0.01<x<0.95$, $0.01<y<0.95$, $0.01<z<0.95$ and $0.01<w<0.95$ and α represents a number of oxygen atoms capable of satisfying atomic valence of other elements, and having a temperature region in which the electromagnetic bonding coefficient is greater than $1.0 \times 10^{-5}$ (emu cm/V g) within a temperature range from 250 to 700 K.

7. A material as defined in claim 6, wherein B represents a combination of at least one of elements as defined in claim 6, with at least one of elements selected from the group consisting of Li, Na, Mg, Al, Sc, Nb, Ta, Mo, W, Re, Ru, Os, Rh, Ir, Zn, Cd, Ga, In, Sn, Sb, Bi, Te, Lu, Pa, U and Pu.

8. A material as defined in claim 1, wherein the material excludes a combination of Bi and Fe.

9. A material as defined in claim 6, wherein the material excludes a combination of Bi and Fe.

10. A material as defined in claim 6, wherein A represents one or more of elements selected from Na, K, Cs, Ca, Sr, Ba, Y, Cu, Cd, In, Tl, Pb, Bi, lanthanide series element, Pu and Am.

11. A material as defined in claim 6, wherein C represents one or more of elements selected from Na, K, Ca, Sr, Cd, Ba, Pb, Bi, La, Li, Ce, Nd, Y, Er, Ho, Tm, Yb and Lu.

12. A material as defined in claim 6, wherein D represents one or more of elements selected from Nb, Ta, Ti, Zr, Hf, Fe, I, Mg, W, Cd, Mn, Co, Re, Sc, Nd, Ni, In, Yb, Ho, Lu, Li, Zn, Cr, Sb, Sn, Al, V and Y.

* * * * *